(12) United States Patent
Morrison et al.

(10) Patent No.: US 9,150,410 B2
(45) Date of Patent: Oct. 6, 2015

(54) COATINGS FOR RELATIVELY MOVABLE SURFACES

(71) Applicant: TEXAS INSTRUMENTS INCORPORATED, Dallas, TX (US)

(72) Inventors: William Robert Morrison, Dallas, TX (US); Mark Christopher Fisher, Farmersville, TX (US); Murali Hanabe, Plano, TX (US); Ganapathy Subramaniam Sivakumar, Allen, TX (US); Simon Joshua Jacobs, Lucas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/333,829

(22) Filed: Jul. 17, 2014

(65) Prior Publication Data

US 2014/0329392 A1    Nov. 6, 2014

Related U.S. Application Data

(62) Division of application No. 13/784,423, filed on Mar. 4, 2013, now Pat. No. 8,803,296.

(60) Provisional application No. 61/738,927, filed on Dec. 18, 2012.

(51) Int. Cl.
| | |
|---|---|
| H01L 21/31 | (2006.01) |
| H01L 21/469 | (2006.01) |
| B81C 1/00 | (2006.01) |
| B81B 7/00 | (2006.01) |
| H04W 4/02 | (2009.01) |
| H01L 21/02 | (2006.01) |
| B81B 3/00 | (2006.01) |

(52) U.S. Cl.
CPC ............ *B81C 1/0096* (2013.01); *B81B 3/0005* (2013.01); *B81B 7/0032* (2013.01); *B81C 1/00261* (2013.01); *H01L 21/02112* (2013.01); *H04W 4/02* (2013.01); *Y02B 60/50* (2013.01); *Y10S 257/914* (2013.01)

(58) Field of Classification Search
CPC ............... H01L 21/0228; H01L 21/02271; H01L 21/02376; H01L 21/02513; H01L 21/02527; H01L 21/3003; H01L 21/3146; H01L 21/3127; B81B 7/0003; B81B 7/0035; B81B 7/0032; B81B 7/008; B81B 7/0048; B81B 7/0061; C23C 16/272; C23C 16/277; C23C 18/06
USPC ......... 438/476, 106, 474, 475, 477, 518, 602, 438/772, 779; 257/E21.17, E21.126, 257/E21.127, E21.212, E21.305, E21.319, 257/E21.321, E21.613
See application file for complete search history.

(56) References Cited

U.S. PATENT DOCUMENTS

| | | | | |
|---|---|---|---|---|
| 7,560,285 B2 * | 7/2009 | Sun | ............... | 436/164 |
| 7,931,592 B2 * | 4/2011 | Currie et al. | ............... | 600/309 |
| 8,426,028 B2 * | 4/2013 | Cai et al. | ............... | 428/446 |
| 8,696,987 B2 * | 4/2014 | Solomon et al. | ............... | 422/43 |
| 8,803,296 B2 * | 8/2014 | Morrison et al. | ............... | 257/632 |

* cited by examiner

*Primary Examiner* — David Nhu
(74) *Attorney, Agent, or Firm* — Jacqueline J. Garner; Frank D. Cimino

(57) ABSTRACT

A device has a microelectromechanical system (MEMS) component with at least one surface and a coating disposed on at least a portion of the surface. The coating has a compound of the formula M(CnF2n+1Or), wherein M is a polar head group and wherein n≥2r. The value of n may range from 2 to about 20, and the value of r may range from 1 to about 10. The value of n plus r may range from 3 to about 30, and a ratio of n:r may have a value of about 2:1 to about 20:1.

10 Claims, 3 Drawing Sheets

PERFLUORODECANOIC
ACID (PFDA)

PERFLUOROOCTANE-
SULFONIC ACID (PFOS)

PERFLUOROOCTANE-
PHOSPHONIC ACID

N-HYDROXY-
PERFLUOROOCTANAMIDE

202 ↓   204 ↓   206 ↓   208 ↓

PERFLUORO-3-
OXADECANOIC
ACID

PERFLUORO-2-
OXAOCTANE-
SULFONIC ACID

PERFLUORO-2-
OXAOCTANE-
PHOSPHONIC ACID

N-HYDROXY-
PERFLUORO-2-
OXAOCTANAMIDE

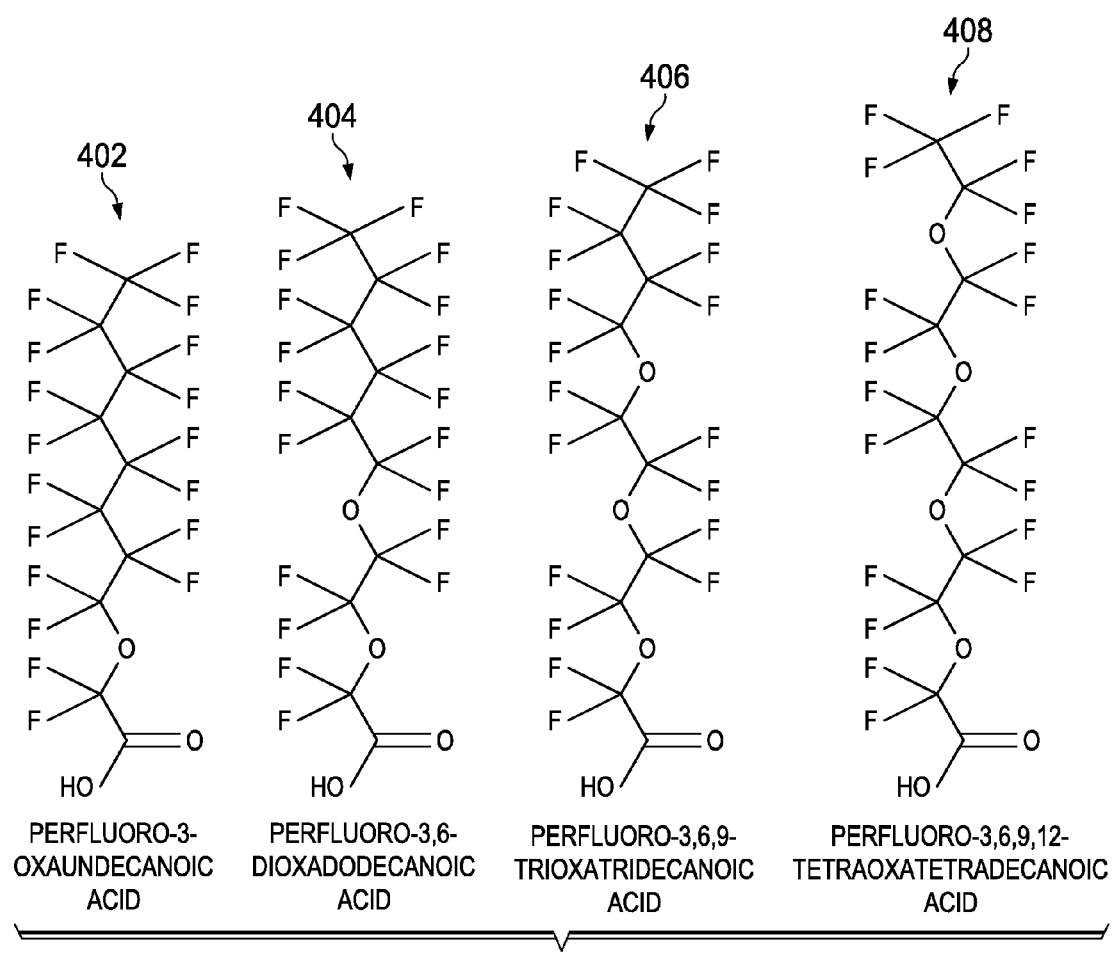
FIG. 4
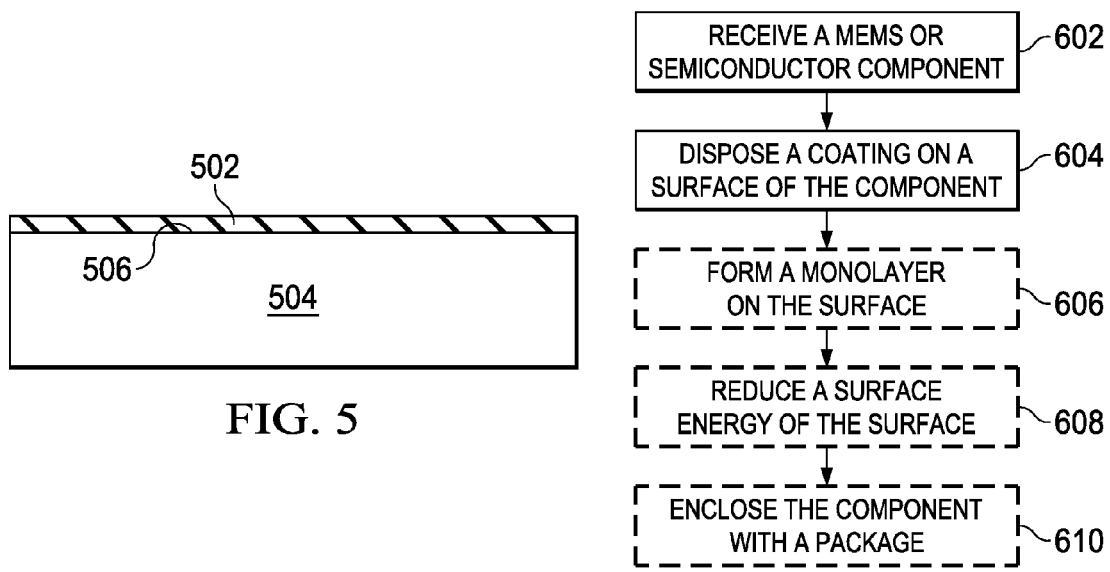
FIG. 5
FIG. 6

COATINGS FOR RELATIVELY MOVABLE SURFACES

CROSS-REFERENCE TO RELATED APPLICATIONS

This application is a divisional of U.S. patent application Ser. No. 13/784,423, filed on Mar. 4, 2013, U.S. Pat. No. 8,803,296 B2, which claims priority to and the benefit of U.S. Provisional Patent Application Ser. No. 61/738,927, filed on Dec. 18, 2012, entitled "Coatings for Relatively Movable Surfaces," by W. Morrison, et al., both of which are incorporated herein by reference in their entirety for all purposes.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Microelectromechanical system (MEMS) devices such as actuators, switches, motors, sensors, variable capacitors, spatial light modulators (SLMs) and similar microelectronic devices can have movable elements. For example, a typical SLM device comprises an array of movable elements in the form of individually addressable light modulator elements whose respective "on" or "off" positions are set in response to input data to either pass or block transmission or reflectance of light directed at the array from an illumination source. In the case of an SLM device used in an image projection system, the input data corresponds to bits of bit frames generated from pixel hue and intensity information data of an image frame of an image input signal. The bit frames may be compilations of bits in a pulse-width modulation scheme that utilizes weighted time segment "on" or "off" periods for generation of corresponding pixel hue and intensity by eye integration during a given available image frame display period. A representative example of an SLM device includes a digital micromirror device (DMD), such as a Texas Instruments DLP™ micromirror array device. DLP™ devices have been employed widely commercially including in televisions, cinemagraphic projection systems, business-related projectors, and picoprojectors.

The mechanical performance of the moving elements within a MEMS device can be compromised by unintended adhesion. This type of adhesion can be reduced by coating contacting elements of the MEMS device with a coating such as a passivating agent or lubricant. The coating can be added to address several problems with device operation. One such problem is static friction (stiction). Another problem can include dynamic friction, which arises from the contact of moving elements in the device. Effective coatings can aid in reducing stiction and dynamic friction by reducing the surface energy of the device. For rotating devices (such as a micromirror supported for rotation on a hinge in a DMD), repeated movement displaces molecules and permanently biases the zero state of the rotation. Passivation layers may reduce this hinge memory accumulation by stabilizing certain states of the surface.

SUMMARY

In an embodiment, a device comprises a MEMS component comprising at least one surface and a coating disposed on at least a portion of the surface. The coating comprises a compound of the formula $M(C_nF_{2n+1}O_r)$, wherein M comprises a polar head group, and wherein $n \geq 2r$. The polar head group may comprise a central atom having a coordination number of 3, 4, or 5, at least one oxygen atom bound to the central atom, and/or a hydroxyl functional group bound to the central atom. The polar head group may comprise at least one functional group selected from the group consisting of: a carboxylic acid functional group; a sulfonic acid functional group, a phosphonic acid functional group, an amide functional group, and a hydroxamide functional group. The value of n may range from 2 to about 20, and the value of r may range from 1 to about 10. The value of n+r may range from 3 to about 30, and a ratio of n:r may have a value of about 2:1 to about 20:1. The MEMS component may comprise a digital micromirror device. The MEMS component may comprise at least one of an actuator, a motor, an RF switch, a sensor, a variable capacitor, an optical modulator, a microgear, an accelerometer, a transducer, a fluid nozzle, a gyroscope, or any combination thereof. The coating may be disposed on the at least the portion of the surface as a self-assembling monolayer. A polydispersity of the compound may be less than about 2.0. The compound may comprise at least one material selected from the group consisting of: a perfluoropoly(alkylene)monoether carboxylic acid, a perfluoro(alkylene)monoether sulfonic acid, a perfluoro(alkylene)monoether phosphonic acid, a perfluoro(alkylene)monoether carboxamide, and a perfluoro(alkylene)monoether hydroxamide, a perfluoropoly(alkylene)polyether carboxylic acid, a perfluoro(alkylene)polyether sulfonic acid, a perfluoro(alkylene)polyether phosphonic acid, a perfluoro(alkylene)polyether carboxamide, and a perfluoro(alkylene)polyether hydroxamide. The compound may comprise at least one material selected from the group consisting of: perfluoro-3-oxadecanoic acid, perfluoro-2-oxaoctane-sulfonic acid, perfluoro-2-oxaoctanephosphonic acid, N-hydroxy-perfluoro-2-oxaoctanamide, perfluoro-4-oxaheptanoic acid, perfluoro-4-oxaoctanoic acid, perfluoro-4-oxanonanoic acid, perfluoro-4-oxadecanoic acid, perfluoro-3-oxaundecanoic acid, perfluoro-3,6-dioxadodecanoic acid, perfluoro-3,6,9-trioxatridecanoic acid, and perfluoro-3,6,9,12-tetraoxatetrdecanoic acid.

In an embodiment, a device comprises a MEMS component or semiconductor component comprising at least one surface and a coating disposed on the surface. The coating comprises a compound comprising a hydrophilic head group bound to a hydrophobic tail, and the hydrophobic tail comprises a fluorinated carbon chain and at least one ether functional group disposed within the fluorinated carbon chain. The hydrophobic tail may comprise 1 to 10 ether functional groups disposed within the fluorinated carbon chain, 2 to 20 carbon atoms, and/or 3-30 total backbone atoms in the fluorinated carbon chain. The hydrophobic tail may comprise a plurality of ether functional groups disposed within the fluorinated carbon chain, and/or a number of carbon atoms in the fluorinated carbon chain separating sequential ether groups may range from 1-6 carbon atoms. The fluorinated carbon chain may comprise a perfluorinated carbon chain. The coating may form a monolayer on the surface. The hydrophilic head group may be configured to have a chemisorption interaction with the at least one surface. The MEMS component may be configured to move relative to one or more surrounding structures.

In an embodiment, a method of protecting a device comprises receiving a MEMS component or semiconductor component, and disposing a coating on at least one surface of the MEMS component or semiconductor component. The coating comprises an amphiphilic compound comprising a hydrophilic head group bound to a hydrophobic tail, and the hydrophobic tail comprises a fluorinated carbon chain and at least one ether functional group disposed within the fluorinated carbon chain. The amphiphilic compound may comprise a compound of the formula $M(C_nF_{2n+1}O_r)$, where M is the hydrophilic head group, $(C_nF_{2n+1}O_r)$ is the hydrophobic tail, and where $n \geq 2r$. The hydrophobic tail may comprise 1 to 10 ether functional groups disposed within the fluorinated carbon chain, and/or 2 to 20 carbon atoms. The hydrophobic tail may comprise a plurality of ether functional groups disposed within the fluorinated carbon chain, and a number of carbon atoms in the fluorinated carbon chain separating sequential ether groups ranges from 1-6 carbon atoms. The fluorinated carbon chain may comprise a perfluorinated carbon chain. Disposing the coating may comprise performing a vapor deposition process. The method may also include forming a monolayer on the at least one surface. The method may further include enclosing the MEMS component or semiconductor component within a package after disposing the coating on the at least one surface. The method may still further include reducing a surface energy of the at least one surface relative to an uncoated surface using the coating.

These and other features will be more clearly understood from the following detailed description taken in conjunction with the accompanying drawings and claims.

BRIEF DESCRIPTION OF THE DRAWINGS

For a more complete understanding of the present disclosure and the advantages thereof, reference is now made to the following brief description, taken in connection with the accompanying drawings and detailed description:

FIG. 4 is a schematic illustration of several embodiments of coating compounds having different numbers of ether functional groups in the hydrophobic tail section.

FIG. 5 is a schematic illustration of an embodiment of a coating on a surface.

FIG. 6 is a flowchart of a method disposing a coating compound on a surface according to an embodiment.

DETAILED DESCRIPTION OF THE EMBODIMENTS

Figure 1:
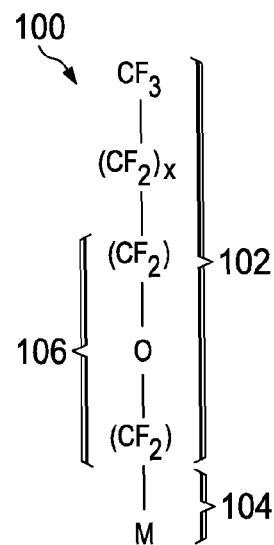
FIG. 1 is a schematic illustration of an embodiment of a coating compound.

In the drawings and description that follow, like parts are typically marked throughout the specification and drawings with the same reference numerals, respectively. The drawing figures are not necessarily to scale. Certain features of the invention may be shown exaggerated in scale or in somewhat schematic form and some details of conventional elements may not be shown in the interest of clarity and conciseness. Specific embodiments are described in detail and are shown in the drawings, with the understanding that the present disclosure is to be considered an exemplification of the principles of the invention, and is not intended to limit the invention to that illustrated and described herein. It is to be fully recognized that the different teachings of the embodiments discussed infra may be employed separately or in any suitable combination to produce desired results.

In the following discussion and in the claims, the terms "including" and "comprising" are used in an open-ended fashion, and thus should be interpreted to mean "including, but not limited to . . . ". The various characteristics mentioned above, as well as other features and characteristics described in more detail below, will be readily apparent to those skilled in the art with the aid of this disclosure upon reading the following detailed description of the embodiments, and by referring to the accompanying drawings.

On a micrometer or smaller scale, atomic level and microscopic level forces between surfaces in contact become significant. Problems related to these types of forces are accordingly relevant to micromechanical devices, such as microelectromechanical system (MEMS) and nanoelectromechanical system (NEMS) devices. In particular, "stiction" forces created between moving parts that contact each other, either intentionally or accidentally, during operation can be a problem with micromechanical devices. Stiction-type failures occur when the interfacial attraction forces created between moving parts that come into contact with one another exceed restoring forces. Stiction can cause surfaces of these parts to either permanently or temporarily adhere to each other, causing device failure and/or malfunction. Stiction forces are complex surface phenomena that generally include capillary forces, van der Waals forces, and electrostatic attraction forces. As used herein, the term "contact" refers generally to any interaction between two surfaces and is not limited to the actual physical touching of the surfaces. Typical micromechanical devices and/or devices comprising semiconductor components can include, but are not limited to, RF switches, optical modulators, microgears, accelerometers, worm gears, transducers, fluid nozzles, gyroscopes, and other similar devices or actuators. It should be noted that the term "MEMS" device or component is used hereafter to generally describe a micromechanical device, and includes both MEMS and NEMS devices.

MEMS and/or semiconductor components, which can experience repeated physical contact between moving parts, may utilize a coating compound for lubrication to reduce or prevent stiction and/or dynamic friction. Various elements in these devices often interact with each other during operation at frequencies between a few hertz (Hz) and a few gigahertz (GHz). Without adding some form of lubrication to these types of devices to reduce stiction and wear between component surfaces, product lifetimes may range from only a few contacts to a few thousand contacts, which is generally well below a commercially viable lifetime.

Lubrication to reduce the stiction within operating MEMS devices may be achieved through the use of one or more chemical coatings on element surfaces. Many types of coating compounds such as alcohols, siloxanes and perfluorinated alkanoic acids can be used as MEMS device lubricants. The vapor phase deposition of the coating compound may result in a self-assembling monolayer (SAM) or similar ultra-thin layer of the lubricant growing over the surface of the element, thus preventing its functional elements from making direct contact and permanently adhering to each other through surface energy effects/forces. For example, the DMD SLM has in some embodiments benefited from the use of saturated perfluorinated carboxylic acids as a lubricant, including those having carbon chains lengths of $C_8$ and longer. However, the use of the saturated perfluorinated carboxylic acids can be chemically incompatible with portions of a MEMS device. The saturated perfluorinated carboxylic acids may only be suitable within limited operating ranges, thereby limiting the operating conditions of the device.

Disclosed herein is a coating compound for use with a MEMS device or a semiconductor device. The coating compound may provide lubrication, passivation, and/or surface protection for one or more surfaces of the MEMS device and/or a semiconductor device. The coating may generally comprise a tail having one or more ether groups interspersed along a carbon chain. Such a configuration may improve the compatibility of the coating with the components of the MEMS and extend acceptable performance of the device over a broader range of operating conditions. As used herein, the term coating compound is intended to describe a material adapted to provide lubrication, anti-stiction, and/or anti-wear properties to contact surfaces. The coating compound may generally be in a liquid, vapor and/or gaseous state during the operation and storage of a MEMS device.

The presently described coating compounds differ from previous coatings in that they comprise an amphiphilic molecule containing one or more ether functional groups interspersed in the carbon backbone of a hydrophobic tail section. In an embodiment shown in FIG. 1, an embodiment of an amphiphilic molecule 100 comprises a compound having a hydrophilic head group 104 (e.g., M) bound to a hydrophobic tail section 102, and the hydrophobic tail section 102 comprises at least one ether functional group 106 (e.g., R—O—R') disposed within the carbon chain of the hydrophobic tail. The hydrophobic tail section may comprise a partially or fully fluorinated carbon chain. Various compounds may be formed by modifying the particular placements of the ether group(s), by changing the number of ether groups present in the hydrophobic tail section, by changing the length and/or the branching of the hydrophobic tail section, and/or by changing the composition of the hydrophilic head group. The particular number and configuration of the ether groups will modify the performance and durability of any coating formed with the amphiphilic molecule.

In an embodiment, the coating may comprise a compound of one of the formulas:

(Formula I)

(Formula II)

Formulas I and II represent partially (Formula I) and fully (Formula II) fluorinated (e.g., perfluorinated) coating compounds. In Formula I and II, M represents a polar head group that may generally be hydrophilic, $(C_n(H,F)_{2n+1}O_r)$ represents a partially fluorinated hydrophobic tail section, and $(C_nF_{2n+1}O_r)$ represents a perfluorinated hydrophobic tail section. The polar head group may comprise any polar or hydrophilic moiety configured to interact with a surface of a MEMS device or semiconductor device, such as through a chemisorption interaction. In an embodiment, M may comprise a central atom having a coordination number of 3, 4, or 5. A hydroxyl functional group may be bound to the central atom, and in some embodiments, the polar head group may comprise at least one oxygen atom. In an embodiment, the central atom may be an oxygen atom. Various functional groups may be used to form the polar head group, and suitable functional groups may include, but are not limited to, a carboxylic acid functional group (e.g., R—COOH), a sulfonic acid functional group (e.g., R—S(=O)$_2$—OH), a phosphonic acid functional group (e.g., R—P(=O)$_2$—OH), an amide functional group (e.g., R—CONH$_2$), a hydroxamide functional group (e.g., R—CONHOH), or any combination thereof.

In Formula I and II, the subscripts n and r follow the relationship: n≥2r. In an embodiment, the number of carbon atoms in the hydrophobic tail may range from 2 to about 20 carbon atoms (e.g., 2≤n≤20), or alternatively from about 4 to about 16 carbon atoms (e.g., 4≤n≤16). The number of oxygen atoms present in the ether groups in the hydrophobic tail section may range from 1 to 10 (e.g., 1≤r≤10). One or more heteroatoms (e.g., O, N, S, etc.) may be present in the hydrophobic tail section, and the total atom count in the backbone chain structure may range from 3 to about 30 atoms or alternatively from about 5 to about 18. As an example, the total of n plus r may range from 3 to about 30, or alternatively from about 5 to about 18.

The hydrophobic tail section of the amphiphilic molecule may contain one, two, three, or more ether groups interrupting the carbon chain. In an embodiment with only a single ether group disposed within the hydrophobic tail section, the single ether group may be disposed at any position within the hydrophobic tail section so long as the carbon chain of the hydrophobic tail section begins and ends with a carbon atom. For example, the amphiphilic molecule may be represented by the formula:

(Formula III)

In Formula III, the value of x may range from 1 to about 18, the value of y may range from 0 to about 19, and the total of x and y may range from 2 to about 19. While Formula III is shown as a perfluorinated compound, one or more of the fluorine atoms may be substituted with hydrogen to provide a partially fluorinated coating compound.

In an embodiment, a plurality of ether groups may be present in the hydrophobic tail section, and the oxygen atoms of the ether groups in the hydrophobic tail section may be disposed at any positions within the tail section so long as they are separated by at least one carbon atom, and so long as the carbon chain of the hydrophobic tail section begins and ends with a carbon atom. In an embodiment, the ether groups within the hydrophobic tail section may be separated by at least one carbon atom, and in an embodiment, the ether groups may be separated by six or fewer carbon atoms. Since an ether group includes a central oxygen atom bound to two adjacent carbon atoms, the ratio of n:r in Formula I may have a minimum value of 2:1 and range as high as about 20:1, though higher values may be possible.

Specific examples of the coating compound according to Formula I can include, among others, a perfluoropoly(alkylene)polyether carboxylic acid, a perfluoro(alkylene)polyether sulfonic acid, a perfluoro(alkylene)polyether phosphonic acid, a perfluoro(alkylene)polyether carboxamide, a perfluoro(alkylene)polyether hydroxamide, or any combination thereof. The molecules of the coating compound may be approximately monodisperse, in that they can be formed from distinct, purified monomers or monodisperse oligomers. Such molecules can be classified as small-to-medium sized molecules rather than polymers. In an embodiment, the polydispersity of such lubricants (e.g., the polydispersity index) may be less than about 2.0, less than about 1.5, less than about 1.25, or about 1.0. In an embodiment, the polydispersity may be as close to 1 as practically achievable through normal means of chemical synthesis and purification.

Figure 2:
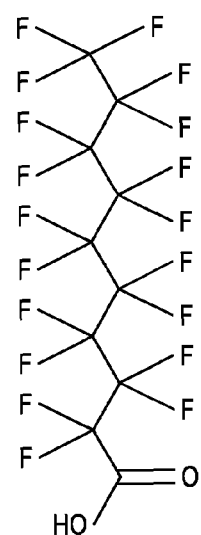
FIG. 2 is a schematic illustration of several embodiments of coating compounds having different polar head groups.
Figure 2:
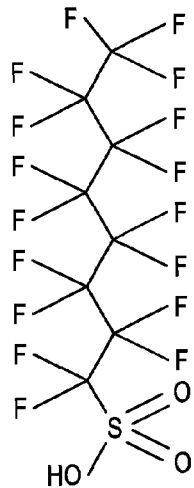
Figure 2:
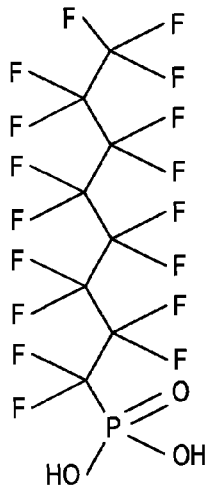
Figure 2:
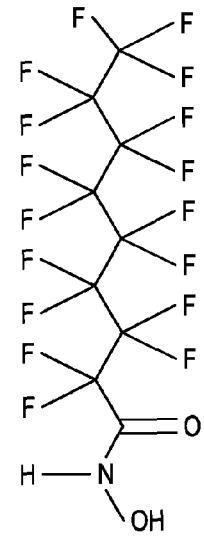
Figure 2:
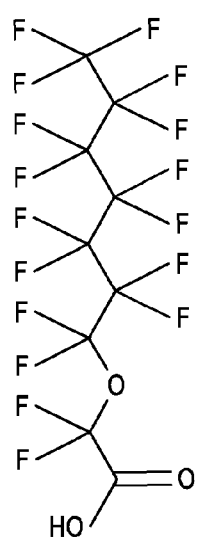
Figure 2:
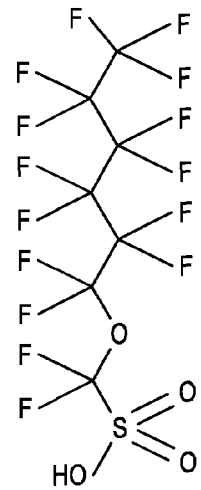
Figure 2:
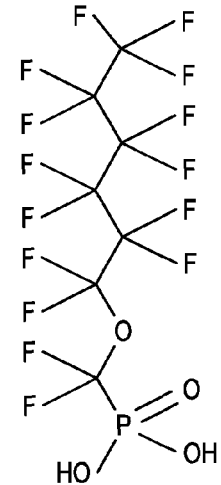
Figure 2:
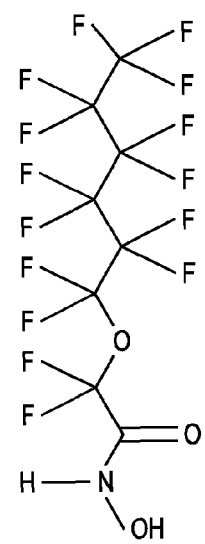

To illustrate the diversity of coating compounds that can be synthesized and used with a MEMS or semiconductor component, a series of embodiments is first described in which the polar head group is modified. As shown in FIG. 2, a first coating compound 202 comprises perfluoro-3-oxadecanoic acid. In this embodiment, the polar head group comprises a carboxylic acid functional group, and the hydrophobic tail section comprises $C_8F_{17}O$. Substitution of the polar head group while leaving the hydrophobic tail section the same results in a variety of coating compound including: perfluoro-2-oxaoctane-sulfonic acid 204 (e.g., having a polar head group comprising a sulfonic acid functional group); perfluoro-2-oxaoctane-phosphonic acid 206 (e.g., having a polar head group comprising a phosphonic acid functional group);

and N-hydroxy-perfluoro-2-oxaoctanamide 208 (e.g., having a polar head group comprising an amide functional group).

Figure 3:
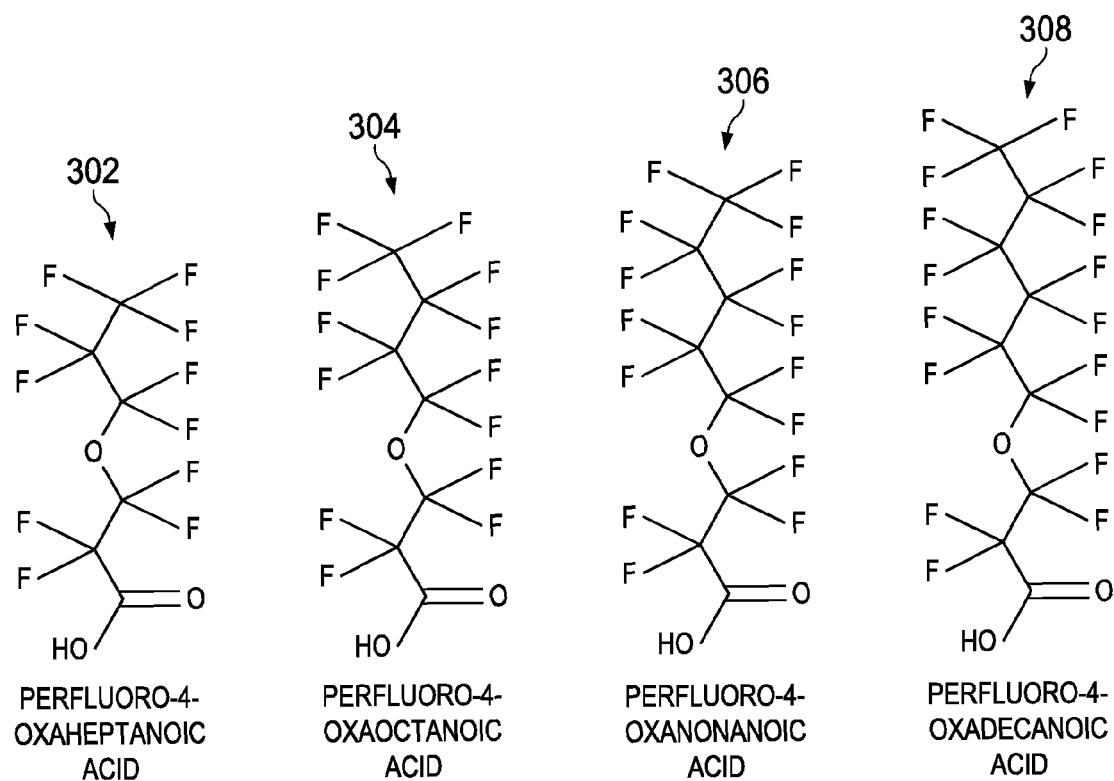
FIG. 3 is a schematic illustration of several embodiments of coating compounds having different hydrophobic tail section lengths.

As illustrated in FIG. 3, a series of embodiments is shown in which the carbon chain length is modified while the placement of a single ether group within the tail section remains the same. The sequential modification starts with perfluoro-4-oxaheptanoic acid (COOH)—($C_5F_{11}O$) 302 having a carboxylic acid functional head group (COOH) and a hydrophobic tail section ($C_5F_{11}O$) comprising a single ether group. With the hydrophobic tail section, the ether group divides the carbon chain in the hydrophobic tail section into a first section having two carbon atoms and a second section having three carbon atoms. Sequentially adding additional carbon atoms to the tail section creates the molecules, perfluoro-4-oxaoctanoic acid (COOH)—($C_6F_{13}O$) 304, perfluoro-4-oxanonanoic acid (COOH)—($C_7F_{15}O$) 306, and perfluoro-4-oxadecanoic acid (COOH)—($C_8F_{17}O$) 308, each having different physical properties and performances as coating compound for a MEMS or semiconductor component.

As illustrated in FIG. 4, another series of embodiments is shown in which the number of carbon atoms in the coating compound molecule's backbone remains constant while changing the number of ether groups present. The sequential modification starts with perfluoro-3-oxaundecanoic acid (COOH)—($C_9F_{19}O$) 402, having a carboxylic acid functional head group (COOH) and a hydrophobic tail section ($C_9F_{19}O$) comprising a single ether group located near the polar head group. Additional ether groups may be added to obtain perfluoro-3,6-dioxadodecanoic acid (COOH)—($C_9F_{19}O_2$) 404, perfluoro-3,6,9-trioxatridecanoic acid (COOH)—($C_9F_{19}O_3$) 406, and perfluoro-3,6,9,12-trioxatridecanoic acid (COOH)—($C_9F_{19}O_4$) 408, each having different physical properties and performances as coating compound for a MEMS or semiconductor component. For example, the coating compound may comprise perfluoro-3,6,9-trioxatridecanoic acid (COOH)—($C_9F_{19}O_3$) (e.g., molecule 406 in FIG. 4). This molecule is similar to a saturated perfluoro-compound perfluorodecanoic acid (PFDA) except for three ether (R—O—R') functional groups that have been introduced into its carbon backbone at various intervals. Rather than having a continuous sequence of ten carbon atoms as found in the PFDA backbone, the coating compound has an overall backbone structure with a C—C—C—C—O—C—C—O—C—C—O—C—C atom sequence. Here, the molecule is amphiphilic, containing a polar head group (i.e., carboxylic acid functional head group) and a perfluoroalkyl tail group. This molecule is functionally and chemically distinct from common perfluoropolyether lubricants that contain polar functional groups at each end of the molecule.

The coating compound molecules may be synthesized using any suitable reaction route. For example, the coating compounds may be elaborated from their hydrocarbon analogs by methods including direct fluorination and functional group interconversion as taught, for example, by U.S. Pat. No. 5,753,776 to Bierschenk et al. which is incorporated herein by reference in its entirety. Suitable compounds may also be obtained commercially from suppliers such as Matrix Scientific of Columbia, S.C. and Synquest Laboratories of Alachua, Fla. Additional synthesis routes may also be used as would be apparent to one of ordinary skill in the art with the aid of this disclosure.

The embodiments illustrated in FIGS. 2-4 are provided for illustration. Additional permutations consistent with the teachings of the present disclosure may provide additional compounds and molecules in addition to those specifically illustrated and/or listed herein to create any coating compound with the physical properties desired for a specific MEMS application.

As schematically illustrated in FIG. 5, the coating compounds 502 described herein may be used to coat at least a portion of a surface 506 of a MEMS or semiconductor component 504. In general, the coating compounds 502 may contact a surface 506 and interact with the surface 506 to reduce the surface energy of the component 504 relative to an uncoated surface. In an embodiment, the coating compounds 502 may be configured to have a chemisorption interaction with the surface 506. The interaction of a coating compound 502 with the surface 506 may allow the coating compound 502 to form a relatively thin coating on the surface 506, which may comprise an ordered array of molecules, as described in more detail herein. The coating compounds 502 described herein may be useful with a MEMS or semiconductor component 504 having a functionality characterized by intermittent surface-to-surface contact of mechanical elements (e.g., such as in DMDs, microactuators, or devices with similarly relatively movable elements), a continuous surface-to-surface sliding contact of mechanical elements (e.g., in a micromotor, microactuator, or similarly operating device), a functionality derived through the controlled surface energy of the surfaces on elements (e.g., such as in a sensor or equivalent device), a functionality derived through the protection or passivation of the surfaces on elements (e.g., such as in a sensor or equivalent device), and/or a functionality derived through the dielectric properties of the surfaces on elements (e.g., such as in a variable capacitor, microswitch, or equivalent device). The coating compounds 502 may also be useful in other situations where a modified surface is part of any device or machine that benefits from having functional surfaces coated with a hydrophobic passivant or lubricant. Suitable MEMS and/or semiconductor components 504 may include, but are not limited to, radio frequency (RF) switches, optical modulators (e.g., SLMs), microgears, accelerometers, worm gears, transducers, fluid nozzles, gyroscopes, and other similar devices or actuators.

In an embodiment, a MEMS device may comprise a digital micromirror device (DMD) such as a Texas Instruments DLP™ micromirror device. The DMD generally comprises a mirror/yoke assembly configured to rotate on a torsion hinge until the yoke tips contact (land on) landing pads. In some cases the mirror/yoke assemblies become slow in lifting off the landing pad, affecting the response of the device and in other cases the assemblies become permanently stuck to the landing pads. One of the primary causes of stiction has been shown to be that of the landing tips scrubbing into the metal landing pads. The stiction problem may be addressed by coating or passivating the metal surfaces of the devices with any of the coating compounds described herein. The coating compound(s) may tend to decrease the van der Waals forces associated with the mirror assemblies in the DMD or any moving parts in a MEMS device, and thereby reduce the tendency for the mirrors to stick to the landing pads.

In an embodiment, a MEMS and/or semiconductor component may be incorporated into a larger assembly or package. The coating compound may be disposed over a portion of the MEMS and/or semiconductor component prior to the component being disposed in the package, or the package, including the MEMS and/or semiconductor component, may be coated with the coating compound prior to being sealed. Such packages may retain the coating compound, protect against contaminants such as dust, moisture, and the like, and generally protect the MEMS and/or semiconductor component.

In an embodiment, a DMD may be incorporated into a device package. The package may comprise a frame and a lid such as cover glass. The cover glass can be made opaque on the underside with a transparent aperture for optical interfacing with the device. As mentioned, this stiction problem has normally been addressed by attempting to control the environment inside the packages. For example, the coating compound can be disposed on the DMD within the package and then sealed to retain the coating compound within the package. As discussed in more detail herein, the coating compound may exist as a thin layer of liquid in equilibrium with a vapor. The package may then act to contain not only the MEMS and/or semiconductor device, but also to retain the coating compound within the package. The coating compound may be in a solid or liquid state, depending on the properties of the material, and the temperature and pressure or environment in which the coating compound is placed. In general, the terms a "solid" or a "liquid" coating compound refers to a compound that is in a solid or liquid state under ambient conditions, i.e., room temperature and atmospheric pressure. The term "vapor" phase coating compound generally describes a mixture of components that contain a carrier gas (e.g., nitrogen) and a vaporized component that is a solid or liquid at temperatures and pressures near ambient conditions (e.g., STP).

Whether formed on a portion of a surface of a MEMS and/or semiconductor component, over an entire surface, and/or contained within a larger package, the coating compound may form a thin layer on the MEMS and/or semiconductor component. In an embodiment, a MEMS and/or semiconductor component may be received (e.g., step 602 of FIG. 6) and a coating may be disposed on a surface of the component (e.g., step 604 of FIG. 6). The coating compound may be capable of forming a monolayer or self-assembled monolayers (SAMs) at the device surface based on the amphiphilic nature of the compounds (e.g., Step 606 of FIG. 6). In order to form a monolayer or SAM, the coating compound may be exposed to the surface and the hydrophilic head group of the molecule may bond/interact to the MEMS and/or semiconductor surface in an orientation that points its hydrophobic tail section away from the surface. Van der Waals and dispersion forces can cause the tails to adopt a closely packed orientation upon a sufficient molecular density on the surface. For some coating compounds, substantially all of the molecules may align this way to give a nearly crystalline order. Some molecules may interact with other molecules rather than the surface. Still further, the composition of the hydrophobic tail section may affect the packing efficiency of the monolayer. The misalignments and secondary molecular interactions may create an imperfect, SAM-like coating on the surface of the MEMS and/or semiconductor component surface. As used herein, the term monolayer may refer to a SAM, a SAM-like layer, or other monolayer.

Once the MEMS surfaces are coated with a sufficiently dense and organized SAM or SAM-like layer, the surface energies can be reduced, and the incidence of adherence may be reduced or eliminated (e.g., Step 608 of FIG. 6). Increasing fluorination of the hydrophobic tail section can provide for a lower surface energy performance. The use of the ether groups in the hydrophobic tail section of the coating compounds described herein may limit the degree of self-assembly achievable with the coating compound described herein.

Any suitable method for depositing a thin film layer or a coating on a surface of a MEMS or semiconductor component may be used. Suitable methods may include, but are not limited to, an evaporative deposition process, a spin-on or spray on process, or any other suitable techniques. In evaporative deposition, evaporated material condenses on a substrate to form a layer. In spin-on, spray-on, or dip-on deposition, a coating material is applied, typically from a solvent solution of the coating material, and the solvent is subsequently evaporated to leave the coating material on the substrate.

In any of the application processes, the surface of the MEMS and/or semiconductor component should be exposed to the coating compound for a time sufficient for a coating or layer (e.g., a monolayer) to form. The time may be in the range of minutes to hours. The resulting thin film may vary in thickness from about 3 angstroms (Å) to about 1,000 Å. For any process, monolayer formation can be verified by measuring liquid contact angles on a test surface. Once the coating has been applied, the MEMS and/or semiconductor component may be enclosed and/or sealed within a package or larger container (e.g., step 608 of FIG. 6).

The disposition of the coating compound on the surface of the MEMS component and/or semiconductor component may result in a thin layer of material that can damaged or displaced due to impact or wear created by the interaction of the various moving components. Such contact may occur in MEMS and/or semiconductor components with contacting surfaces that are subject to frequent contact in use and a large number of contacts during the product lifetime, such as in optical modulators (e.g., a SLM, an RF switch, etc.). In an embodiment, the particular coating compound or combination of coating compounds may be selected so that a portion of the coating compound vaporizes to form a vapor or gas within the processing region during normal operation of the device. The ability of the coating compound to form a vapor or gas is dependent on coating compound equilibrium partial pressure, which varies as a function of the temperature (e.g., expected operating temperature range) of the coating compound, the pressure of the region surrounding the coating compound, the coating compound bond strength to internal surfaces of the processing region, and the coating compound molecular weight. In another embodiment, the coating compound may be selected based, at least in part, on its ability to diffuse along a surface of the MEMS and/or semiconductor component within the processing region. In this embodiment, one or more surfaces of the MEMS and/or semiconductor component, or package in which the component is contained, may be treated to act as wetting surfaces for the coating compound. In this way, coating compound may be mobile to allow replacement coating compound to flow into any damaged layer of the coating compound.

In terms of the coating compounds described herein, the selection of the number of ether groups present in the hydrophobic tail section may be based, at least in part, on considerations such as the resulting molecular weight of the coating compound and the melting point and/or vapor pressure of the coating compound over the expected operating range. In an embodiment, the ether groups within the coating compound may allow the MEMS and/or semiconductor component to operate at a temperature that is within an extended operating temperature range. For example, the coating compound may be configured to allow a MEMS and/or semiconductor component to operate at a temperature ranging from about $-50°$ C. to about $150°$ C., or about $0°$ C. to about $100°$ C.

It should be understood that the MEMS and/or semiconductor devices described herein are not intended in any way to limit the scope of the invention described herein, since one skilled in the art would appreciate that the various embodiments described herein could be used in other MEMS, NEMS, larger scale actuators or sensors, or other comparable devices that experience stiction or other similar problems.

EXAMPLES

The disclosure having been generally described, the following examples are given as particular embodiments of the disclosure and to demonstrate the practice and advantages thereof. It is understood that the examples are given by way of illustration and are not intended to limit the specification or the claims in any manner.

Example 1

Lubrication of a Standard XGA DMD

In a first example, a MEMS component comprising a DMD was coated with a coating compound as described herein. Immediately after micromirrors of a DMD were released from their underlying silicon substrate, perfluoro-4-oxadecanoic acid was applied from the vapor phase to coat all exposed surfaces of the DMD with a SAM. At this point in the DMD's manufacturing sequence, the perfluoro-4-oxadecanoic acid did not act as a lubricant but rather as a passivant film, protecting the MEMS elements from attack by ambient moisture until additional intermediate processing on the device could be completed. Just prior to sealing the DMD with a lid, the device was again exposed to vacuum and a new coating of perfluoro-4-oxadecanoic acid applied, again from the vapor phase. After the completion of all assembly processes, the DMD was tested under various environmental conditions of light, heat, and moisture to evaluate the mechanical performance of its micromirrors. It was observed that relative to PFDA, perfluoro-4-oxadecanoic acid was about 10% less effective as a lubricant and that a slightly additional amount of motive force was required to toggle the micromirrors between their ON and OFF states. However, this coating compound was found to be more resistant to moisture degradation, allowing for higher levels of moisture to be present within the package. Additional DMD devices of this type containing the perfluoro-4-oxadecanoic acid coating compound were tested and were found to operate nominally when installed in typical business or consumer grade digital projector products.

Example 2

Lubrication of a High-Lumens XGA DMD

In a second example, another MEMS component comprising a DMD was coated with a coating compound as described herein. The DMD device tested was representative of DMD devices installed in digital projectors that have higher than typical operating temperatures and light load. Previous testing found that perfluoro-4-oxadecanoic acid was a less reliable lubricant under these conditions. Engineering evaluations found that perfluoro-3,6,9-trioxatridecanoic acid with a $C_4$ carbon tail was a suitable drop-in replacement for perfluoro-4-oxadecanoic acid, and DMDs containing this coating compound were assembled using the manufacturing sequence described in Example 1, above. After the completion of all assembly processes, these DMDs were tested under various environmental conditions of light, heat, and moisture to evaluate the mechanical performance of their micromirrors. It was observed that relative to PFDA, perfluoro-3,6,9-trioxatridecanoic acid was about 15% less effective as a coating compound and that a slightly additional amount of motive force was required to toggle the micromirrors between their ON and OFF states. However, this coating compound was more resistant to photochemical and thermal degradation present in this type of application.

Example 3

WVGA DMD with Improved Cold Start Capability

In a third example, another MEMS component comprising a DMD was coated with a coating compound as described herein. The DMD device tested was representative of DMD devices installed in digital projector systems that are deployed in sub-freezing temperature environments. Engineering evaluations found that perfluoro-3,6,9-trioxatridecanoic acid was a suitable lubricant under these conditions, and DMDs containing this coating compound were then assembled using the manufacturing sequence described in Example 1, above. After the completion of all assembly processes, these DMDs were tested under sub-freezing temperature environmental conditions to evaluate the mechanical performance of their micromirrors. It was observed that relative to PFDA, perfluoro-3,6,9-trioxatridecanoic acid extended the cold operating limit of the devices by several tens of Celsius degrees lower than possible with the use of PFDA.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_1$, and an upper limit, $R_u$, is disclosed, any number falling within the range is specifically disclosed. In particular, the following numbers within the range are specifically disclosed: $R=R_1+k*(R_u-R_1)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. Use of the term "optionally" with respect to any element of a claim means that the element is required, or alternatively, the element is not required, both alternatives being within the scope of the claim. Use of broader terms such as comprises, includes, and having should be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present invention.

The invention claimed is:

1. A method of protecting a device, the method comprising:
   receiving a microelectromechanical system (MEMS) component or semiconductor component; and
   disposing a coating on a surface of the MEMS component or the semiconductor component,
   wherein the coating comprises an amphiphilic compound comprising a hydrophilic head group bound to a hydrophobic tail, wherein the hydrophobic tail comprises a fluorinated carbon chain and at least one ether functional group disposed within the fluorinated carbon chain.

2. The method of claim 1, wherein the amphiphilic compound comprises a compound of the formula $M(C_nF_{2n+1}O_r)$, wherein M is the hydrophilic head group, wherein $(C_nF_{2n+1}O_r)$ is the hydrophobic tail, and wherein $n \geq 2r$.

3. The method of claim 1, wherein the hydrophobic tail comprises 1 to about 10 ether functional groups disposed within the fluorinated carbon chain.

4. The method of claim 1, wherein the hydrophobic tail comprises 2 to about 20 carbon atoms.

5. The method of claim 1, wherein the hydrophobic tail comprises a plurality of ether functional groups disposed within the fluorinated carbon chain, and wherein a number of carbon atoms in the fluorinated carbon chain separating sequential ether groups ranges from 1-6 carbon atoms.

6. The method of claim 1, wherein the fluorinated carbon chain comprises a perfluorinated carbon chain.

7. The method of claim 1, wherein disposing the coating comprises performing a vapor deposition process.

8. The method of claim 1, further comprising forming a monolayer on the at least one surface.

9. The method of claim 1, further comprising enclosing the MEMS component or semiconductor component within a package after disposing the coating on the at least one surface.

10. The method of claim 1, further comprising reducing a surface energy of the at least one surface relative to an uncoated surface using the coating.

* * * * *